United States Patent [19]

Rivaud et al.

[11] Patent Number: 4,888,298
[45] Date of Patent: Dec. 19, 1989

[54] PROCESS TO ELIMINATE THE RE-ENTRANT PROFILE IN A DOUBLE POLYSILICON GATE STRUCTURE

[75] Inventors: Lydia L. Rivaud; Paul Roselle, both of Rochester; David Losee, Fairport, all of N.Y.

[73] Assignee: Eastman Kodak Company, Rochester, N.Y.

[21] Appl. No.: 288,910

[22] Filed: Dec. 23, 1988

[51] Int. Cl.⁴ .................. H01L 21/283; H01L 29/78
[52] U.S. Cl. ........................................ 437/43; 437/53; 437/191; 357/24
[58] Field of Search .................. 437/43, 53, 191, 195; 357/23.5, 24; 156/643

[56] References Cited

U.S. PATENT DOCUMENTS

| | | | |
|---|---|---|---|
| 4,332,078 | 6/1982 | Peek et al. | 357/24 |
| 4,363,696 | 12/1982 | Nagakubo et al. | 437/195 |
| 4,417,947 | 11/1983 | Pan | 156/643 |

FOREIGN PATENT DOCUMENTS

| | | | |
|---|---|---|---|
| 58-80871 | 5/1983 | Japan | 437/52 |
| 58-82537 | 5/1983 | Japan | 437/195 |
| 58-92268 | 6/1983 | Japan | 437/43 |
| 61-207053 | 9/1986 | Japan | 437/52 |

Primary Examiner—Olik Chaudhuri
Attorney, Agent, or Firm—Raymond L. Owens

[57] ABSTRACT

A process is described to eliminate the re-entrant profile in double polysilicon gate structures commonly used in VLSI microelectronic devices such as CCDs is eliminated by depositing a conformal insulating layer (5) on the poly-oxide layer (4), plasma etching to form spacer (6), oxidizing gate electrode (3) and substrate (10 to form oxide layer (7), and forming overlapping second gate electrode (8).

1 Claim, 2 Drawing Sheets

PROCESS TO ELIMINATE THE RE-ENTRANT PROFILE IN A DOUBLE POLYSILICON GATE STRUCTURE

CROSS-REFERENCE TO RELATED APPLICATIONS

Reference is made to commonly-assigned U.S. patent application Ser. No. 289,061 entitled Forming a First Polysilicon Gate in Double Polysilicon Gate Structures Without a Lifted Edge filed in the names of Lydia Rivaud, Paul Roselle and David Losee on even date herewith.

FIELD OF THE INVENTION

The present invention relates to making microelectronic devices and, more particularly, to the elimination of the re-entrant profile in double polysilicon gate structures commonly found on some VLSI devices such as charged coupled devices (CCDs).

BACKGROUND OF THE INVENTION

Double polysilicon gate structures are widely used in microelectronic fabrication owing to the inertness and stability of polysilicon at high temperatures (e.g. 1200° C.). This property is useful in devices like CCDs where the electrodes have to be formed in the early steps of the process. Poly-ox, or oxide thermally grown from polysilicon, is widely used as a dielectric to insulate gate interconnects in two level polysilicon gate structures. Any weakness in the poly-ox is a potential reliability problem in devices such as CCDs that require two levels of polysilicon. The weakness in the dielectric properties of the poly-ox film is often related to the presence of a re-entrant profile formed during thermal oxidation of poly-1. This problem is illustrated in FIG. 1.

FIG. 1 shows a cross-sectional view of a double polysilicon gate structure. Layer 1 represents the Si substrate, layer 2 the gate oxide, layer 3 the first polysilicon gate or poly-1, layer 4 the poly-ox, and layer 5 the second polysilicon gate or poly-2. The re-entrant profile is shown in circled region 6. It appears as a protruding lower edge in poly-2. Since electrical charge accumulates preferentially in edges and corners of a conductive material, the re-entrant profile provides an edge for charge build-up that can cause electrical shorts between poly-1 and overlapping poly-2 gate electrodes.

In U.S. Pat. No. 4,417,947 to Pan, the problem of the re-entrant profile is discussed and a method for the prevention of its formation is disclosed. However, this method requires the formation of a sloped poly-1 edge. A sloped poly-1 edge is not desirable if the first gate is to be used as an implant mask. For this application a vertical poly-1 profile is mandatory.

SUMMARY OF THE INVENTION

In view of the foregoing discussion, the primary object of this invention is the elimination of the re-entrant profile of the poly-2 edge, where the poly-1 edge has a vertical profile. The elimination of this feature in double polysilicon gate structures will result in the reduction of electrical shorts between poly-2 and poly-1, thus enhancing yield and reliability of devices utilizing the structure.

MODES OF CARRYING OUT THE INVENTION

Figure 1:
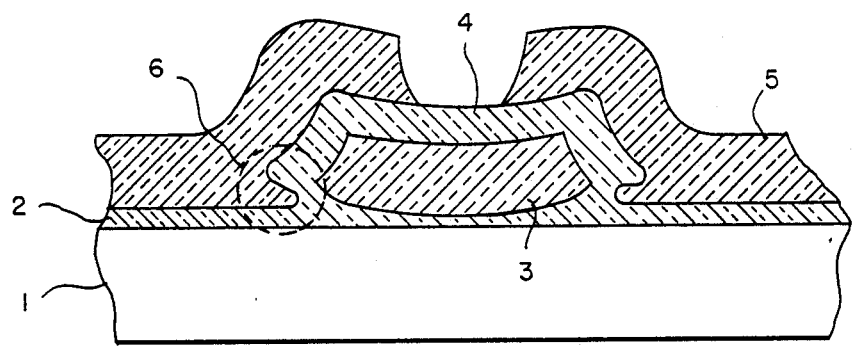
FIG. 1 is a cross-section of a prior art device which has the problems the present invention is meant to eliminate.

With reference to FIG. 2, in accordance with the invention, a process for the elimination of the re-entrant profile in double polysilicon structures is described. Where layers are similar the same numbering sequence as in FIG. 1 will be used.

Figure 2A:
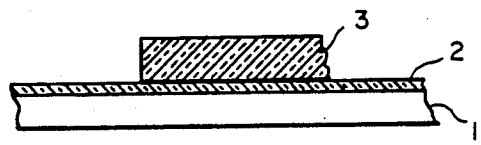
FIGS. 2a-f illustrate the sequence of steps of making a device without a re-entrant profile in accordance with the invention. For sake of clarity, it will be understood that the dimensions, particularly in the vertical direction, are not to scale.

Turning first to FIG. 2a, where in the process of making a CCD device, we see a patterned poly-1 gate 3 and gate oxide layer 2 on a silicon substrate 1.

Figure 2B:
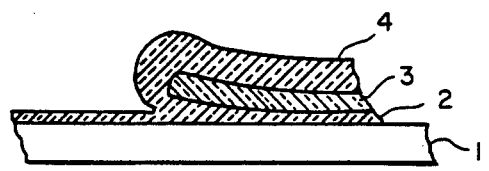

Next in the process, FIG. 2b shows that thermal oxidation of the poly-1 gate produces a poly-ox insulating layer 4. Oxygen diffusion under the poly-1 layer 3 lower edge produces a lift-up, which results from the volume expansion of the oxidized polysilicon, and this in turn leads to a re-entrant profile in the poly-ox.

Figure 2C:
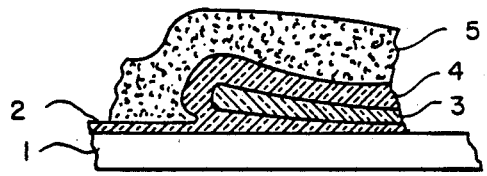

FIG. 2c shows the deposition of a conformal insulating sacrificial layer 5 to fill in the cavity of the re-entrant profile. This sacrificial layer can be a low temperature thermal oxide (LTO), spin on glass, or a plasma oxide, as well understood to those skilled in the art.

Figure 2D:
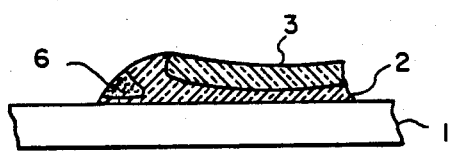

FIG. 2d shows the structure after the deposited layer 5, the poly-ox layer 4, and the gate oxide layer 2 have been etched back by a plasma to expose the poly-1 layer 3. The plasma etch consists of a gas mixture which has anisotropic properties, i.e. it etches preferentially along the vertical direction. The etch is monitored with an optical multichannel analyzer which makes it possible to stop the etch at a chosen endpoint. This etch can be a mixture of $CHF_3$ and $C_2F_6$ or $CHF_3$ and oxygen, which are well known and often used in the art. A spacer 6 is formed along the side of poly-1 layer 3. Spacer 6 is formed partly of poly-ox and partly of the deposited insulating layer 5 that had been filled in the re-entrant cavity.

Figure 2E:
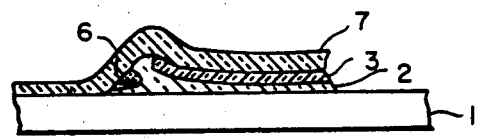

FIG. 2e shows the thermal oxidation, for the second time, of poly-1 to re-establish a poly-ox layer 7.

Figure 2F:
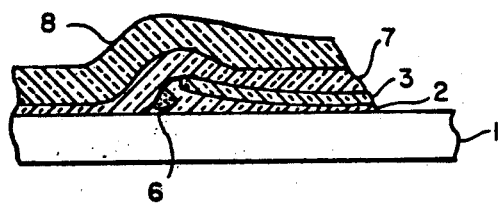

FIG. 2f shows a double polysilicon gate 8 with overlapping poly-1 and poly-2 gate electrodes wherein the re-entrant profile caused by the oxidation of poly-1 has been filled in by a spacer formed by the etch back of a conformal insulating layer. The poly-2 gate electrode is then patterned to the desired length.

EXPERIMENT

A low temperature oxide (LTO) was deposited as one sacrificial insulating layer 5. This layer 5 was deposited to a thickness double that of poly-1 layer 3 to insure that the re-entrant cavity of the poly-ox would be filled up. A $CHF_3$ and $C_2F_6$ plasma etched back the LTO, the poly-ox, and the gate oxide. This etch was anisotropic. The etch was monitored with an optical multichannel analyzer tuned to the CO emission line of the discharge.

After completing steps a-f as shown in FIG. 2, samples were prepared for cross-sectional transmission electron microscopy (XTEM) examination. XTEM micrographs showed the re-entrant profile in the poly-2 gate was eliminated.

Advantages

Re-entrant profiles in double polysilicon gate structures constitute a processing problem which is desirable to eliminate.

By virtue of this invention, an improved gate morphology is produced; the problem of electrical shorts between poly-1 and poly-2 is minimized, thus enhancing device reliability. Also, in the prior art residual ribbons, or stringers, of poly-2 can reside in the re-entrant profile causing poly-2 to poly-2 electrode shorts. This is eliminated by the present invention.

The invention has been described in detail with particular reference to preferred embodiments thereof, but it will be understood that variations and modifications can be effected within the spirit and scope of the invention.

We claim:

1. A method of constructing a microelectronic device having overlapping poly-1 and poly-2 gate electrodes separated by an insulating layer, and wherein the re-entrant profile is eliminated, comprising the steps of:
   (a) forming a poly-1 gate electrode on a gate oxide layer on a substrate;
   (b) oxidizing, for the first time, the poly-1 gate electrode to form a poly-oxide layer, wherein such oxidation causes the lifting of the edge portions of the poly-1 gate to form a re-entrant cavity;
   (c) depositing an insulating sacrificial conformal layer on the poly-oxide layer;
   (d) providing an anisotropic plasma etch to remove the oxide layer to expose the surface of the poly-1 gate electrode and to form a spacer formed partly of the gate oxide, poly-oxide, and insulating layers which fills the re-entrant profile in the poly-oxide; and
   (e) oxidizing, for the second time, the poly-1 gate electrode and the substrate and forming overlapping poly-2 gate electrodes.

* * * * *